United States Patent
Huang et al.

(10) Patent No.: US 10,734,243 B2
(45) Date of Patent: Aug. 4, 2020

(54) ETCHING METHOD AND SUBSTRATE PROCESSING SYSTEM

(71) Applicant: TOKYO ELECTRON LIMITED, Tokyo (JP)

(72) Inventors: Tsuhung Huang, Hsin-chu (CN); Jun Lin, Yamanashi (JP); Takehiko Orii, Yamanashi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/841,147

(22) Filed: Dec. 13, 2017

(65) Prior Publication Data

US 2018/0166295 A1 Jun. 14, 2018

(30) Foreign Application Priority Data

Dec. 13, 2016 (JP) .................. 2016-241516

(51) Int. Cl.
*H01L 21/311* (2006.01)
*H01L 21/67* (2006.01)
*H01L 21/3213* (2006.01)
*H01L 21/677* (2006.01)
*H01L 21/306* (2006.01)

(52) U.S. Cl.
CPC .. *H01L 21/31116* (2013.01); *H01L 21/30604* (2013.01); *H01L 21/32135* (2013.01); *H01L 21/32137* (2013.01); *H01L 21/67069* (2013.01); *H01L 21/67173* (2013.01); *H01L 21/67196* (2013.01); *H01L 21/67742* (2013.01); *H01L 21/67745* (2013.01)

(58) Field of Classification Search
CPC ......... H01L 21/31116; H01L 21/32137; H01L 21/67173; H01L 21/67742; H01L 21/30604; H01L 21/32135; H01L 21/67196; H01L 21/67069; H01L 21/67745

See application file for complete search history.

(56) References Cited

U.S. PATENT DOCUMENTS

| | | | |
|---|---|---|---|
| 5,849,639 A | 12/1998 | Molloy et al. | |
| 2006/0216941 A1* | 9/2006 | Hasebe | H01L 21/31116 438/715 |
| 2012/0214315 A1* | 8/2012 | Nishimura | H01L 21/32137 438/719 |

FOREIGN PATENT DOCUMENTS

| | | |
|---|---|---|
| JP | H07-508313 A | 9/1995 |
| JP | H11-260785 A | 9/1999 |
| KR | 10-2006-0002805 A | 1/2006 |
| KR | 10-2012-0095812 A | 8/2012 |
| WO | 94/00251 A1 | 1/1994 |

* cited by examiner

*Primary Examiner* — Duy Vu N Deo
(74) *Attorney, Agent, or Firm* — Fenwick & West LLP

(57) ABSTRACT

In an etching method for removing a processing target layer formed on a substrate for manufacturing electronic devices, a first break-through process of removing an oxide film formed on a surface of the processing target layer is performed, and a first main etching process of etching the processing target layer is performed after the first break-through process. Then, a second break-through process of removing the oxide film exposed after the first main etching process is performed, and a second main etching process of etching the processing target layer is performed after the second break-through process.

6 Claims, 5 Drawing Sheets

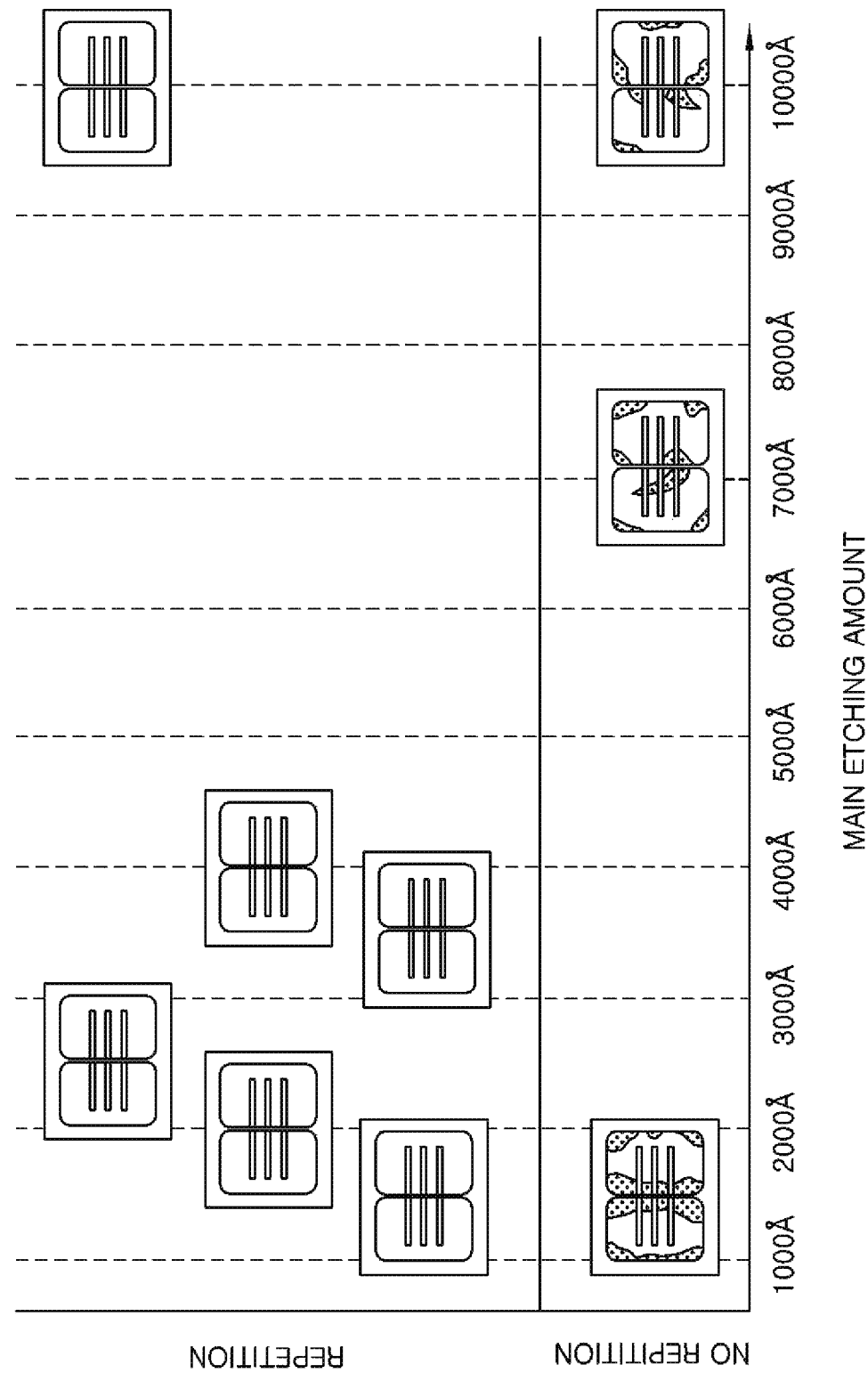

US 10,734,243 B2

ETCHING METHOD AND SUBSTRATE PROCESSING SYSTEM

CROSS-REFERENCE TO RELATED APPLICATIONS

This application claims priority to Japanese Patent Application No. 2016-241516 filed on Dec. 13, 2016, the entire contents of which are incorporated herein by reference.

FIELD OF THE INVENTION

The disclosure relates to an etching method and a substrate processing system for performing the etching method.

BACKGROUND OF THE INVENTION

In a wafer (hereinafter, referred to as "pattern wafer") having a predetermined pattern for manufacturing electronic devices, a silicon oxide film formed by CMP (Chemical Mechanical Polishing) or the like may exist on a surface of a polysilicon layer. The silicon oxide film serves as a mask in etching the polysilicon layer and inhibits etching of the polysilicon layer. Therefore, an etching process for removing the silicon oxide film is performed on the pattern wafer before the etching of the polysilicon layer. The etching process for removing the silicon oxide film is referred to as "break-through process".

The pattern wafer that has been subjected to the break-through process is subjected to an etching process (hereinafter, referred to as "main etching process") for removing the polysilicon layer. However, the polysilicon layer may not be completely removed by the main etching process. In that case, a silicon residue remains on the pattern wafer.

In order to remove the residue, an overetching process in which the main etching process is continued is performed even after the polysilicon layer is substantially completely removed. In addition, there is suggested a technique for introducing a plasma cleaning gas for removing a residue after a main etching process (see, e.g., Japanese Patent Application Publication No. H7-508313) or a technique for changing a residue to a water-soluble residue and removing the water-soluble residue by performing gas plasma treatment on a pattern wafer (see, e.g., Japanese Patent Application Publication No. H11-260785).

However, the electronic devices may be damaged in the case of introducing the plasma cleaning gas after the overetching process or the main etching process or in the case of performing the gas plasma treatment.

SUMMARY OF THE INVENTION

In view of the above, the disclosure provides an etching method capable of preventing devices manufactured from a substrate from being damaged and a substrate processing system.

In accordance with an aspect, there is provided an etching method for removing a processing target layer formed on a substrate for manufacturing electronic devices, the method including: a first break-through process of removing an oxide film formed on a surface of the processing target layer; a first main etching process of etching the processing target layer after the first break-through process; a second break-through process of removing the oxide film exposed after the first main etching process; and a second main etching process of etching the processing target layer after the second break-through process.

In accordance with an aspect, there is provided a substrate processing system for performing an etching process on a substrate for manufacturing electronic devices, the system including: a first break-through unit configured to remove an oxide film formed on a surface of a processing target layer of the substrate; a first main etching unit configured to etch the processing target layer after the removal of the oxide film in the first break-through unit; a second break-through unit configured to remove the oxide film exposed after the etching of the processing target layer in the first main etching unit; and a second main etching unit configured to etch the processing target layer after the removal of the oxide film in the second break-through unit.

BRIEF DESCRIPTION OF THE DRAWINGS

The objects and features of the disclosure will become apparent from the following description of embodiments, given in conjunction with the accompanying drawings, in which:

FIG. 5 schematically shows residues remaining at a bottom portion of a trench after the execution of the conventional polysilicon layer removing method and the execution of the polysilicon layer removing method shown in FIGS. 4A to 4E.

DETAILED DESCRIPTION OF THE EMBODIMENTS

Hereinafter, embodiments will be described in detail with reference to the accompanying drawings.

Figure 1:
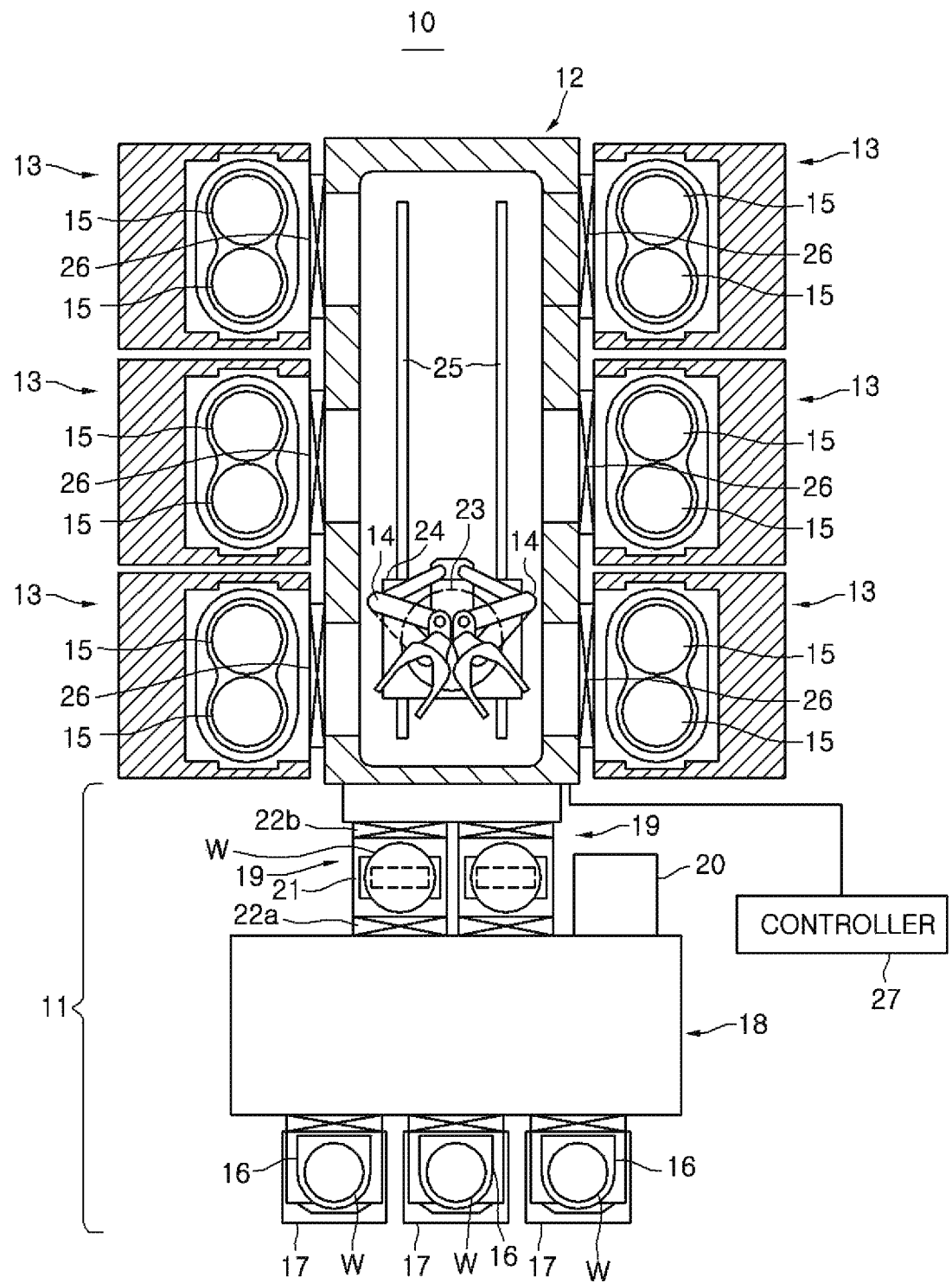
FIG. 1 is a top view schematically showing a configuration of a substrate processing system according to an embodiment.

FIG. 1 is a top view schematically showing a configuration of a substrate processing system according to an embodiment. In FIG. 1, a partial internal structure is illustrated for better understanding.

Referring to FIG. 1, a substrate processing system 10 includes a wafer storage unit 11 for storing a plurality of wafers W, a transfer module 12 serving as a transfer chamber for transferring two wafers W at the same time, a plurality of process modules 13 (first break-through unit, first main etching unit, second break-through unit, second main etching unit) for performing a break-through process and a main etching process on the wafers W loaded from the transfer module 12. The process modules 13 and the transfer module 12 are maintained in a vacuum atmosphere.

In the substrate processing system 10, the wafers W stored in the wafer storage unit 11 are transferred by transfer arms 14 in the transfer module 12 to be respectively mounted on two stages 15 in each of the process modules 13. Next, in the substrate processing system 10, a break-through process and a main etching process are performed on the wafers W mounted on each of the stages 15. The processed wafers W are unloaded to the wafer storage unit 11 by the transfer arms 14.

The wafer storage unit 11 includes: a plurality of load ports 17 serving as mounting places for FOUPs 16 that are containers where a plurality of wafers W is stored; a loader module 18 for receiving the stored wafers W from the FOUPs 16 mounted on the load ports 17 or delivering the wafers W that have been subjected to predetermined processes in the process modules 13 to the FOUPs 16; two load-lock modules 19 for temporarily holding the wafers W to be transferred between the loader module 18 and the transfer module 12; and a cooling storage 20 for cooling a wafer W that has been subjected to PHT (Post Heat Treatment) processing.

The loader module 18 is a rectangular case whose inside is kept in an atmospheric atmosphere. A plurality of load ports 17 is provided at one longitudinal side surface of the loader module 18. The loader module 18 has therein a transfer arm (not shown) capable of moving in the longitudinal direction of the loader module 18. The transfer arm loads the wafers W from the FOUPs 16 mounted on the load ports 17 into the load-lock modules 19 or unloads the wafers W from the load-lock modules 19 to the FOUPs 16.

The load-lock modules 19 temporarily holds the wafers W in order to transfer the wafers W accommodated in the FOUPs 16 mounted on the load ports 17 in an atmospheric atmosphere to the process modules 14 in a vacuum atmosphere. Each of the load-lock modules 19 has a buffer plate 21 for holding two wafers W. Each of the load-lock modules 19 further includes a gate valve 22a for ensuring airtightness with respect to the loader module 18 and a gate valve 22b for ensuring airtightness with respect to the transfer module 12. A gas introducing system and a gas exhaust system (both not shown) are connected to the load-lock modules 19 through lines and control the inside of the load-lock modules 19 to an atmospheric atmosphere or a vacuum atmosphere.

The transfer module 12 loads an unprocessed wafer W into the process module 13 from the wafer storage unit 11 and unloads a processed wafer W from the process module 13 into the wafer storage unit 11. The transfer module 12 is configured as a rectangular housing in a vacuum atmosphere. The transfer module 12 includes two transfer arms 14 for holding and moving two wafers W, a rotating table 23 for rotatably supporting each of the transfer arms 14, a rotation base 24 on which the rotating table 23 is mounted, and a guide rail 25 for guiding the rotation base 24 in the longitudinal direction of the transfer module 12. The transfer module 12 is connected to the load-lock modules 19 of the wafer storage unit 11 via the gate valves 22a and 22b and to the process modules 13 via gate valves 26 to be described later. In the transfer module 12, two wafers W are transferred from the load-lock module 19 to each of the process modules 13 by the transfer arms 14 and two processed wafers W are unloaded from each of the process modules 13 to another process module 13 or to the load-lock modules 19 by the transfer arms 14.

In the substrate processing system 10, each of the process modules 13 performs a break-through process and a main etching process. Specifically, in the break-through process, one of the process modules 13 performs COR (Chemical Oxide Removal) processing and another process module 13 performs PHT processing. In the COR processing, processing gases, e.g., HF gas and $NH_3$ gas, introduced into the process module 13 are adsorbed onto the wafer W and react with a silicon oxide film on a surface of a polysilicon layer, thereby generating AFS (ammonium hexafluorosilicate) as a reaction by-product. In the PHT processing, the wafer W is heated and AFS generated on the wafer W is removed by sublimation. A plasma is not used in both of the COR processing and the PHT processing. In the main etching process, one of the process modules 13 performs etching of the polysilicon layer of the wafer W by using fluorine radicals in the plasma of a processing gas, e.g., $F_2$ gas. In the main etching process, $NH_3$ gas or $N_2$ gas is introduced, in addition to $F_2$ gas, into one of the process modules 13. The operations of the respective components of the substrate processing system 10, which include the operations in the break-through process and the main etching process, are controlled based on a predetermined program by a controller 27.

Figure 2:
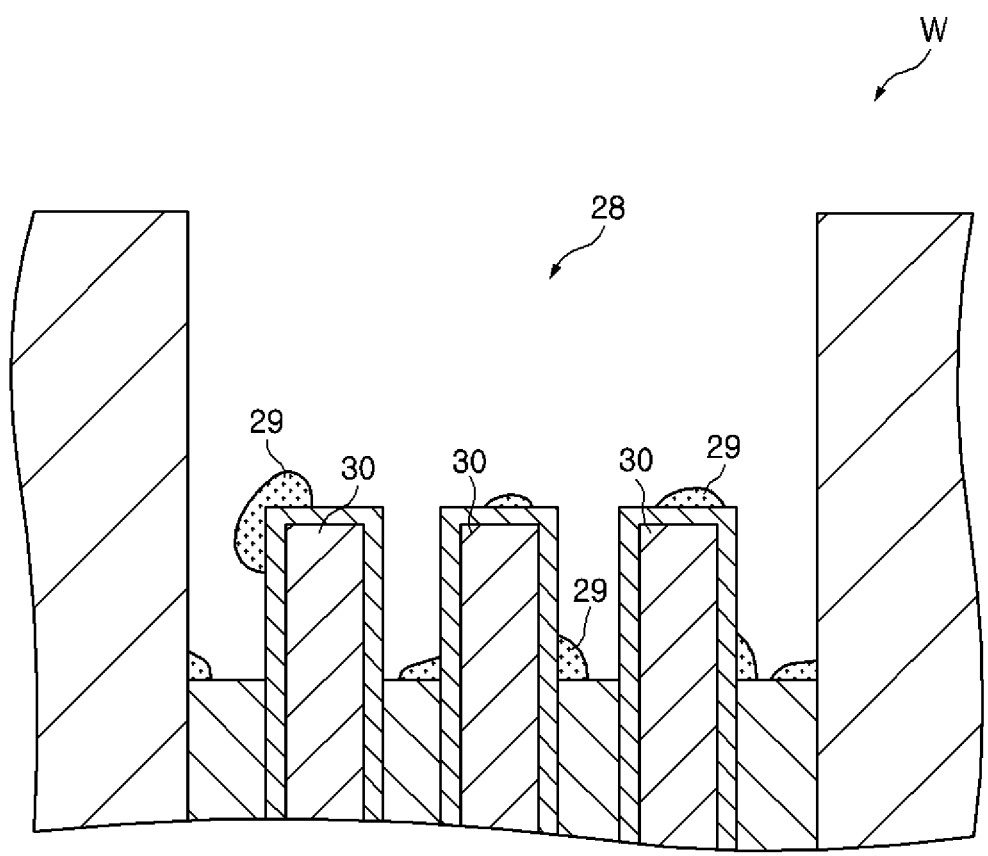
FIG. 2 is a cross sectional view showing residues remaining after execution of a conventional etching method.

FIG. 2 is a cross sectional view showing residues remaining after execution of a conventional etching method.

In the case of performing a conventional break-through process and a conventional main etching process on the wafer W, a structure shown in FIG. 2 in which the polysilicon layer is removed, e.g., a structure in which silicon residues 29 partially remain at a bottom portion of the trench 28, is obtained. Even when a plurality of pins 30 is formed on the bottom portion of the trench 28, the residues 29 remain regardless of the positions of the pins 30.

Figure 3A:
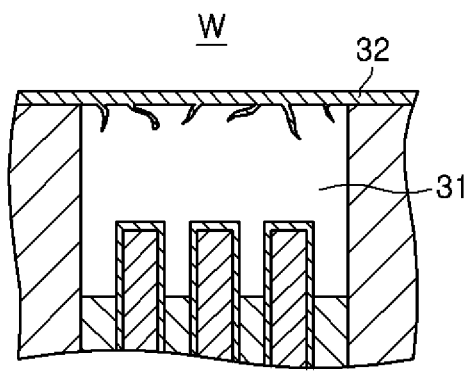
FIGS. 3A to 3D are process diagrams for explaining residue generation mechanism in the conventional etching method.

The present inventors have observed the following mechanism to explain the reason that the silicon residues remain after the break-through process and the main etching process are performed on the wafer W. Specifically, a polysilicon layer (processing target layer) 31 is formed on the wafer W and, then, CMP processing is performed on a surface layer of the wafer W which includes the polysilicon layer 31. Accordingly, silicon of the polysilicon layer 31 reacts with oxygen in air or a polishing agent, thereby forming a silicon oxide film 32 on the surface layer of the wafer W. At this time, grains (lump) of silicon are easily generated near the surface of the polysilicon layer 31 and the silicon oxide film 32 enters gaps between the grains (see FIG. 3A).

Figure 3B:
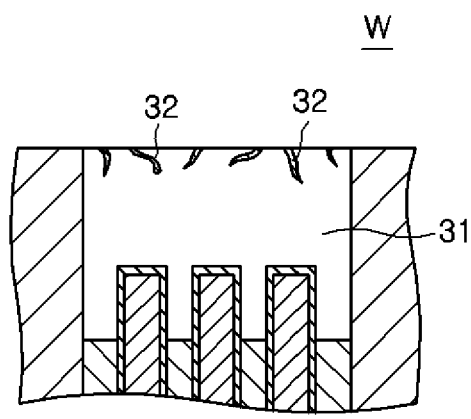

Next, the break-through process is performed on the wafer W and the silicon oxide film 32 formed on the surface layer of the wafer W can be brought into contact with the processing gas. Accordingly, the silicon oxide film 32 is changed to AFS and removed. However, the silicon oxide films 32 in the gaps between the grains are hardly brought into contact with the processing gas and thus remain without being changed to AFS (see FIG. 3B).

Figure 3C:
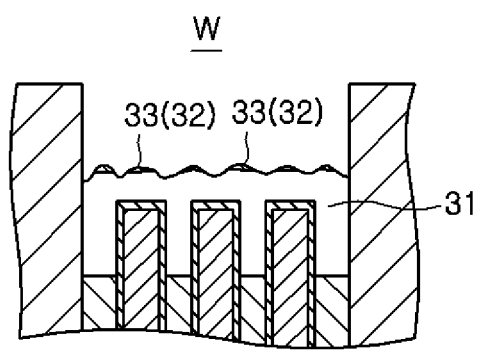
Figure 3D:
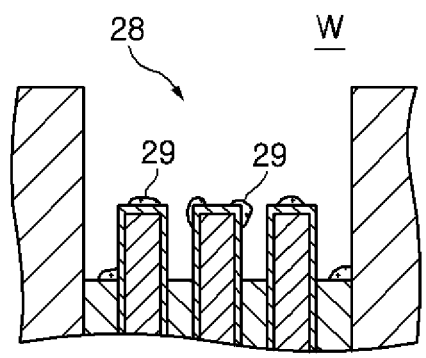

Then, the main etching process is performed on the wafer W. As the etching of the polysilicon layer 31 advances, the silicon oxide films 32 in the gaps between the grains are exposed. The exposed silicon oxide films 32 serve as oxide film masks 33 and partially inhibit etching of the polysilicon layer 31 which will be performed later. In other words, in the polysilicon layer 31, a difference in an etching rate between a portion covered with the oxide film mask 33 and a portion that is not covered with the oxide film mask 33 becomes considerable. Therefore, the polysilicon layer 31 is not uniformly etched (see FIG. 3C). As a result, even if the polysilicon layer 31 is substantially completely removed, the silicon residues 29 are generated at portions that have been covered with the oxide film masks 33 (see FIG. 3D).

Especially, the gaps between the grains are generated regardless of the positions of the pins 30 and the oxide film masks 33 are generated at portions corresponding to the gaps between the grains. Therefore, the residues 29 remain at portions corresponding to the gaps between the grains regardless of the positions of the pins 30. In the present embodiment, the break-through process and the main etching process are performed on the wafer W based on the above-described mechanism in order to remove the oxide film masks 33.

FIGS. 4A to 4E are process diagrams showing a polysilicon layer removing method as an etching method according to an embodiment.

Figure 4A:
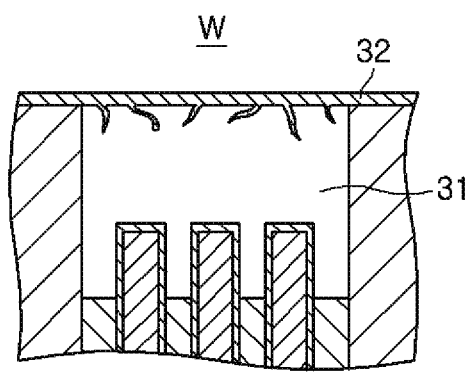
FIGS. 4A to 4E are process diagrams showing a polysilicon layer removing method as an etching method according to an embodiment.
Figure 4B:
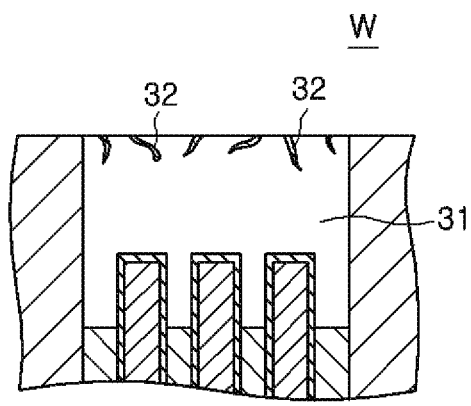

First, a first break-through process is performed on the wafer W having the silicon oxide film 32 on the surface layer thereof (see FIG. 4A). At this time, a pressure in the process module 13 for performing the COR processing is set to, e.g., about 300 mTorr; the flow rate of HF gas introduced into the process module 13 is set to, e.g., about 140 to 160 sccm; a flow rate of $NH_3$ gas introduced into the process module 13 is set to, e.g., about 140 to 160 sccm; and processing time of the first break-through process is set to, e.g., about 40 to 90 sec. In the first break-through process, the silicon oxide film 32 formed on the surface layer of the wafer W is brought into the processing gas and thus is changed to AFS and removed. However, the silicon oxide films 32 in the gaps between the grains are hardly brought into contact with the processing gas and thus remain without being changed to AFS (see FIG. 4B).

Next, a first main etching process is performed on the wafer W. At this time, a pressure in the process module 13 for performing the first main etching process is set to, e.g., about 1 to 1.6 Torr; the flow rate of $F_2$ gas introduced into the process module 13 is set to, e.g., about 300 to 1050 sccm; a flow rate of $NH_3$ gas introduced into the process module 13 is set to, e.g., about 10 to 35 sccm; a flow rate of $N_2$ introduced into the process module 13 is set to, e.g., about 180 to 210 sccm; and a temperature of the wafer W is set to, e.g., 80° C. to 120° C. The processing time of the first main etching process is set to a comparatively short period and, thus, only the vicinity of the surface of the polysilicon layer 31 is etched. As a result, the silicon oxide films 32 in the gaps between the grains are exposed, thereby forming the oxide film masks 33 on the surface of the polysilicon layer 31 (see FIG. 3C).

Figure 4C:
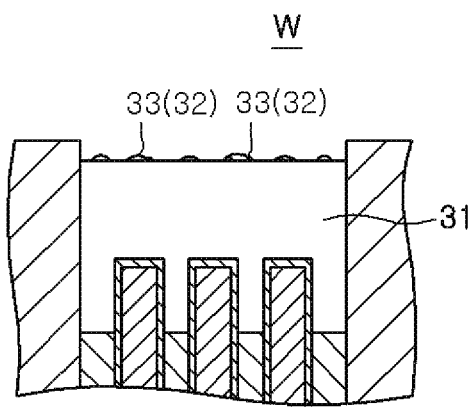
Figure 4D:
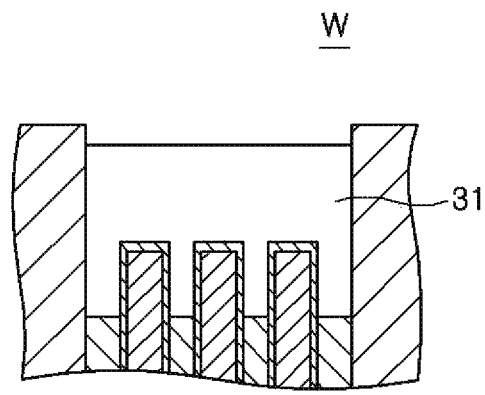
Figure 4E:
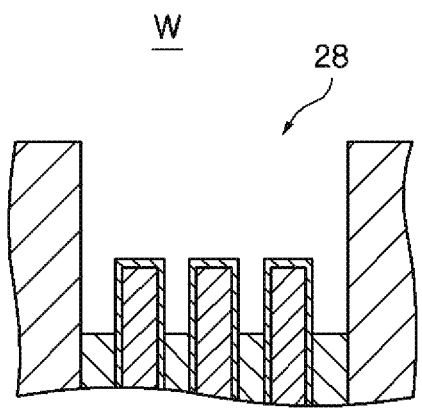

Then, the second break-through process is performed on the wafer W (see FIG. 4C). The conditions of the COR processing at this time are set to be the same as those of the first break-through process. However, the oxide film masks 33 on the surface of the polysilicon layer 31 are brought into contact with the processing gas and thus are changed to AFS and removed (FIG. 4D).

Next, a second main etching process is performed on the wafer W. The conditions of the second main etching process are set to be the same as those of the first main etching process except that the processing time of the second main etching process is longer than that of the first main etching process. Accordingly, the etching amount of the polysilicon layer 41 in the second main etching process becomes greater than that of the polysilicon layer 31 in the first main etching process. At this time, the polysilicon layer 31 is etched as in the first main etching process. Since, however, the oxide film masks 33 have been removed by the second break-through process, the etching of the polysilicon layer 31 is uniformly performed without being partially inhibited. As a result, the residues 29 do not remain at the bottom portion of the trench 28 after the removal of the polysilicon layer 31 (see FIG. 4E). In the second main etching process, the etching of the polysilicon layer 31 and the exhaust of the process module 13 are alternately performed, thereby suppressing the inhibition of the etching of the polysilicon layer 31 by a silicon compound or the like floating in the process module 13.

In the above-described polysilicon layer removing method, the silicon oxide films 32, which are exposed after only the vicinity of the surface of the polysilicon layer 31 is etched, are removed and, thus, it is possible to prevent the silicon oxide films 32 in the gaps between the grains of the polysilicon layer 31 from being exposed after the etching of the vicinity of the surface of the polysilicon layer 31 and serving as the oxide film masks 33. Therefore, it is possible to prevent the residues 29 from partially remaining at the bottom portion of the trench 28 in the second main etching process. Accordingly, it is not required to introduce the plasma cleaning gas after the over etching process or the etching of the polysilicon layer 31. As a result, the devices manufactured from the wafer W can be prevented from being damaged.

In the above-described polysilicon layer removing method, the etching amount of the polysilicon layer 31 in the second main etching process is greater than that of the polysilicon layer 31 in the first main etching process. In other words, the etching amount of the polysilicon layer 31 in the first main etching process is smaller than that of the polysilicon layer 31 in the second main etching process. When the etching amount of the polysilicon layer 31 in the first main etching process is greater, the exposed silicon oxide films 32 serve as masks during the first main etching process and, thus, the shape of the polysilicon layer 31 may be disturbed. However, if the etching amount of the polysilicon layer 31 in the first main etching process is reduced, the exposed silicon oxide films 32 in the gaps between the grains of the polysilicon layer 31 do not serve as masks during the first main etching process. Accordingly, the shape of the polysilicon layer 31 can be prevented from being disturbed during the first main etching process.

While the embodiment has been described, the present disclosure is not limited to the above-described embodiment.

For example, in the above-described polysilicon layer removing method, the break-through process and the main etching process are performed twice. However, the number of execution of the break-through process and the main etching process is not limited thereto. The break-through process and the main etching process may be alternately performed three times or more, for example. Especially, the distribution of the grains near the surface of the polysilicon layer 31 depends on the film forming condition of the polysilicon layer 31. For example, when the polysilicon layer 31 is rapidly formed, a large number of grains are generated and the gaps of the grains may reach a deep portion of the polysilicon layer 31. In that case, the silicon oxide films 32 in the gaps between the grains which have reached the deep portion of the polysilicon layer 31 can be exposed and removed by alternately performing the break-through process and the main etching process three times or more. Accordingly, it is possible to reliably prevent the residues 29 from partially remaining at the bottom portion of the trench 28.

The present disclosure may be applied not only to the case in which the silicon oxide film 32 enters the gap between the grains of the polysilicon layer 31 but also to the case in which a silicon nitride film or carbon enters the gap between the grains. In that case, the etching process for removing the silicon nitride film or carbon and the main etching process are alternately performed twice or more. The film that is etched by the main etching process is not limited to the polysilicon layer 31. The generation of residues can be prevented even when the present disclosure is applied to a metal layer, e.g., a cobalt film, or a silicon nitride layer on which grains may be generated.

The object of the disclosure can also be realized by supplying a recording medium in which a program code of software that realizes the functions of the above-described embodiments is recorded to the controller 27 of the substrate processing system 10, and causing a CPU of the controller 27 to read out and execute the program code recorded in the recording medium.

In this case, the program code itself read out from the recording medium realizes the functions of the above-described embodiments and, thus, the program code and the recording medium in which the program code is recorded constitute the present disclosure.

The recording medium for supplying the program code may be, e.g., a RAM, a NVRAM, a floppy (registered trademark) disk, a hard disk, a magneto-optical disk, an optical disk such as CD-ROM, CD-R, CD-RW, DVD (DVD-ROM, DVD-RAM, DVD-RW, DVD+RW), a magnetic tape, a non-volatile memory card, another ROM or the like which may record the program code. Alternatively, the program code may be downloaded from another computer (not shown), database or the like connected to the Internet, a commercial network or a local area network and then supplied to the controller 27.

The functions of the above-described embodiments may be realized not only by executing the program code read out by the controller 27 but also by causing an OS (operating system) or the like which operates in the CPU to perform a part or all of actual operations based on instructions of the program code.

The functions of the above-described embodiments may also be realized by recording the program code read out from the recording medium in a memory provided for a functional extension board inserted into the controller 27 or a function extension unit connected to the controller 27 and then causing the CPU provided for the functional extension board or the function extension unit to perform a part or all of the actual operations based on the instructions of the program code.

The program code may be an object code, a program code executed by an interpreter, script data supplied to the OS, or the like.

Test Examples

Hereinafter, test examples of the present disclosure will be described.

First, three types of the conventional polysilicon layer removing method were performed. In the conventional polysilicon layer removing methods, the break-through process and the main etching process were performed once on the wafer W having the polysilicon layer 31. In the conventional polysilicon layer removing methods, the etching amount of the polysilicon layer 31 in the main etching process was set to 1500 Å (first comparative example), 7000 Å (second comparative example) and 10000 Å (third comparative example) by controlling the conditions of the main etching process. After the polysilicon layer removing methods were performed, the wafer W was monitored from the top. FIG. 5 schematically shows the residues 29 remaining at the bottom portion of the trench 28.

In addition, six types of the polysilicon layer removing method shown in FIGS. 4A to 4E were performed. In the polysilicon layer removing method shown in FIGS. 4A to 4E, the break-through process and the main etching process were performed twice on the wafer W having the polysilicon layer 31. In the polysilicon layer removing methods, the etching amount of the polysilicon layer 31 in the first main etching process was set to 1500 Å (first test example), 2000 Å (second test example), 2500 Å (third test example), 3500 Å (fourth test example), 4000 Å (fifth test example) and 10000 Å (sixth test example) by controlling the conditions of the first main etching process. As in the comparative examples, the wafer W was monitored from the top after the polysilicon layer removing methods were performed. FIG. 5 schematically shows the residues 29 remaining at the bottom portion of the trench 28. In FIG. 5, "no repetition" indicates the conventional polysilicon layer removing method, and "repetition" indicates the polysilicon layer removing method shown in FIGS. 4A to 4E.

As shown in FIG. 5, in the first to the third comparative example, the residues 29 partially remained at the bottom portion of the trench 28. This is because, as described in the aforementioned mechanism, the silicon oxide films 32 in the gaps between the grains of the polysilicon layer 31 were not removed in the first break-through process and served as the oxide film masks 33, thereby inhibiting the etching of the polysilicon layer 31.

On the other hand, in the first to the sixth test example, partial remaining of the residues 29 at the bottom portion of the trench 28 was not monitored. This is because the silicon oxide films 32 in the gaps between the grains were exposed by the first main etching process and removed by the second break-through process and thus did not serve as the oxide film masks 33 in the second main etching process. However, in the first test example, the shape of the bottom portion of the trench 28 was slightly disturbed. This is because the etching amount of the polysilicon layer 31 in the first main etching process was comparatively small, i.e., 1500 Å, and a small amount of the silicon oxide film 32 remained on the polysilicon layer 31 and served as the oxide film mask 33 in the second main etching process. Accordingly, the polysilicon layer 31 was not uniformly etched and the shape of the bottom portion of the trench 28 was slightly disturbed. From this, it is clear that the etching amount of the polysilicon layer 31 in the first main etching process is preferably set to be 2000 Å or above.

While the disclosure has been shown and described with respect to the embodiments, it will be understood by those skilled in the art that various changes and modifications may be made without departing from the scope of the disclosure as defined in the following claims.

What is claimed is:

1. An etching method for removing a processing target layer formed on a substrate for manufacturing electronic devices, the method comprising:
    a first break-through process of removing an oxide film formed on a surface of the processing target layer;
    a first main etching process of etching the processing target layer after the first break-through process;
    a second break-through process of removing an oxide film in a gap between grains of the processing target layer prior to the first main etching process, the oxide film exposed by the first main etching process; and
    a second main etching process of etching the processing target layer after the second break-through process,
    wherein an etching amount of the processing target layer in the first main etching process is smaller than an etching amount of the processing target layer in the second main etching process, and only a vicinity of a surface of the processing target layer is etched during the first main etching process.

2. The etching method of claim 1, wherein in the first main etching process, an etching amount of the processing target layer is set to be 2000 A or above.

3. The etching method of claim 1, further comprising:
    a third break-through process of removing another oxide film in a gap between grains of the processing target layer prior to the second main etching process, exposed by the second main etching process; and a third main etching process of etching the processing target layer after the third break-through process.

4. The etching method of claim 1, wherein in the first break-through process and the second break-through process, HF gas and $NH_3$ gas are used as processing gases, and wherein in the first main etching process and the second main etching process, at least $F_2$ gas is used as a processing gas.

5. The etching method of claim 1, wherein the processing target layer is one of a silicon layer, a silicon nitride layer and a metal layer.

6. The etching method of claim 1, wherein the first break-through process and the second break-through process are performed without using a plasma.

* * * * *